United States Patent
Nishihara

(10) Patent No.: US 8,456,558 B2
(45) Date of Patent: Jun. 4, 2013

(54) PIXEL CIRCUIT, A SOLID-STATE IMAGE SENSING DEVICE, AND A CAMERA SYSTEM THAT FACILITATES CHARGE TRANSFER WITHIN A PIXEL

(75) Inventor: Toshiyuki Nishihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 348 days.

(21) Appl. No.: 12/829,807

(22) Filed: Jul. 2, 2010

(65) Prior Publication Data

US 2011/0019053 A1 Jan. 27, 2011

(30) Foreign Application Priority Data

Jul. 23, 2009 (JP) ................. 2009-172388

(51) Int. Cl.
*H04N 3/14* (2006.01)
*H04N 5/335* (2006.01)
*H01L 27/00* (2006.01)

(52) U.S. Cl.
USPC .................. 348/308; 348/241; 250/208.1

(58) Field of Classification Search
USPC ................ 348/308, 301, 302, 243, 248
See application file for complete search history.

(56) References Cited

U.S. PATENT DOCUMENTS

| | | | | |
|---|---|---|---|---|
| 6,320,616 B1 * | 11/2001 | Sauer | ......................... | 348/241 |
| 7,355,645 B2 * | 4/2008 | Sakurai et al. | ............... | 348/308 |
| 7,948,540 B2 * | 5/2011 | Ogura et al. | .................. | 348/300 |
| 8,068,155 B2 * | 11/2011 | Muroshima et al. | .......... | 348/294 |
| 8,102,450 B2 * | 1/2012 | Masuyama et al. | ........... | 348/308 |
| 8,212,904 B2 * | 7/2012 | Ishimoto et al. | .............. | 348/301 |
| 2006/0007329 A1 * | 1/2006 | Panicacci | ...................... | 348/241 |
| 2007/0109879 A1 * | 5/2007 | Mabuchi | ....................... | 365/190 |
| 2008/0237449 A1 * | 10/2008 | Altice | ........................ | 250/208.1 |
| 2009/0009644 A1 * | 1/2009 | Kitani | .......................... | 348/308 |
| 2010/0214460 A1 * | 8/2010 | Hasegawa et al. | ............ | 348/300 |
| 2012/0086841 A1 * | 4/2012 | Ono et al. | ..................... | 348/300 |

FOREIGN PATENT DOCUMENTS

JP  2007-535199  11/2007
JP  2010200025 A * 9/2010

* cited by examiner

*Primary Examiner* — John Villecco
(74) *Attorney, Agent, or Firm* — Oblon, Spivak, McClelland, Maier & Neustadt, L.L.P.

(57) ABSTRACT

A pixel circuit includes: a photoelectric conversion device; a source-follower circuit; a transfer transistor that transfers charge generated in the photoelectric conversion device to an input node of the source-follower circuit; and a readout system that reads out a signal in response to the generated charge through the source-follower circuit, wherein the readout system floats the input node of the source-follower circuit and turns on the transfer transistor to transfer the signal charge to the input node, includes a function of turning off the transfer transistor, sensing an output node potential of the source-follower circuit, and reading out an output signal, and further includes an output modulation degree control function unit that temporarily reduces an output modulation degree of the source-follower circuit when the transfer transistor is turned on.

13 Claims, 16 Drawing Sheets

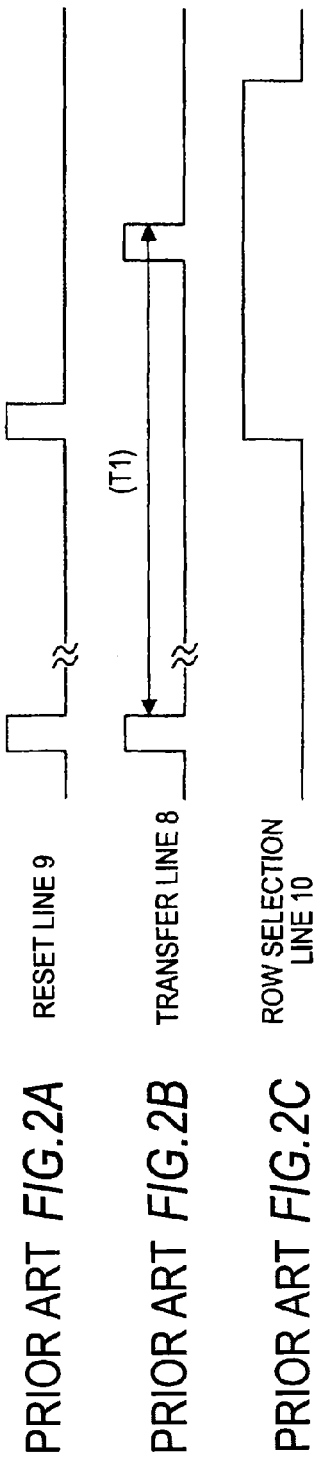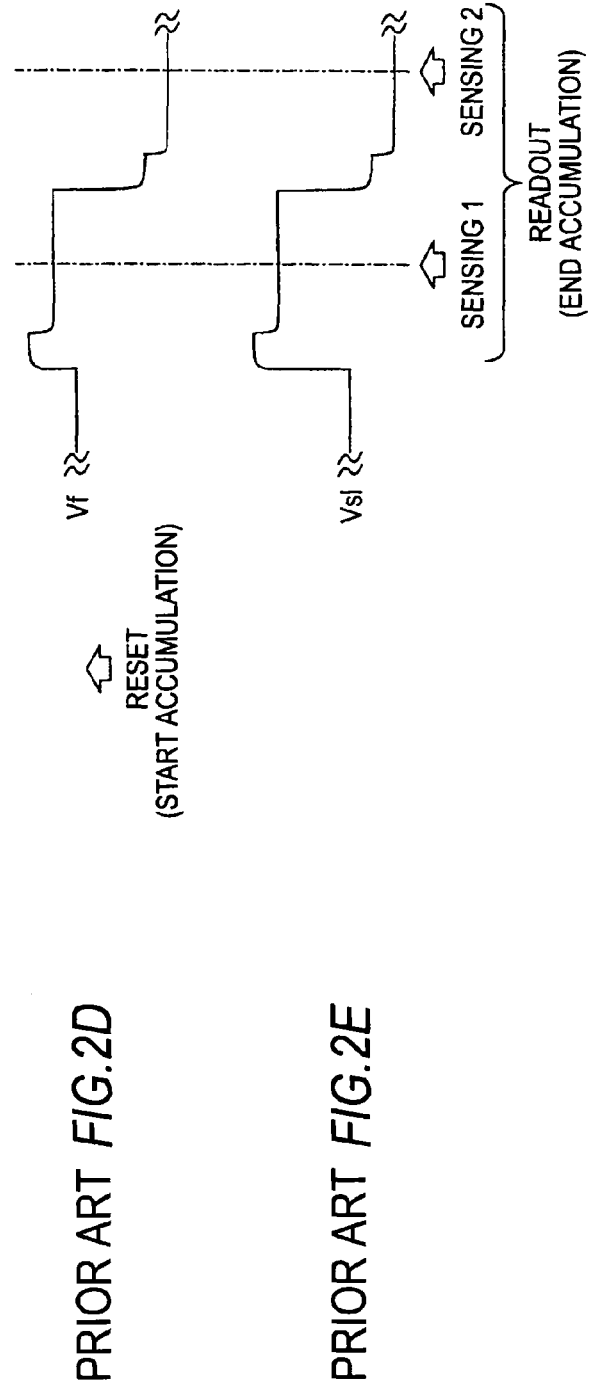

[ST1]

[ST2]

[ST3]

[ST4]

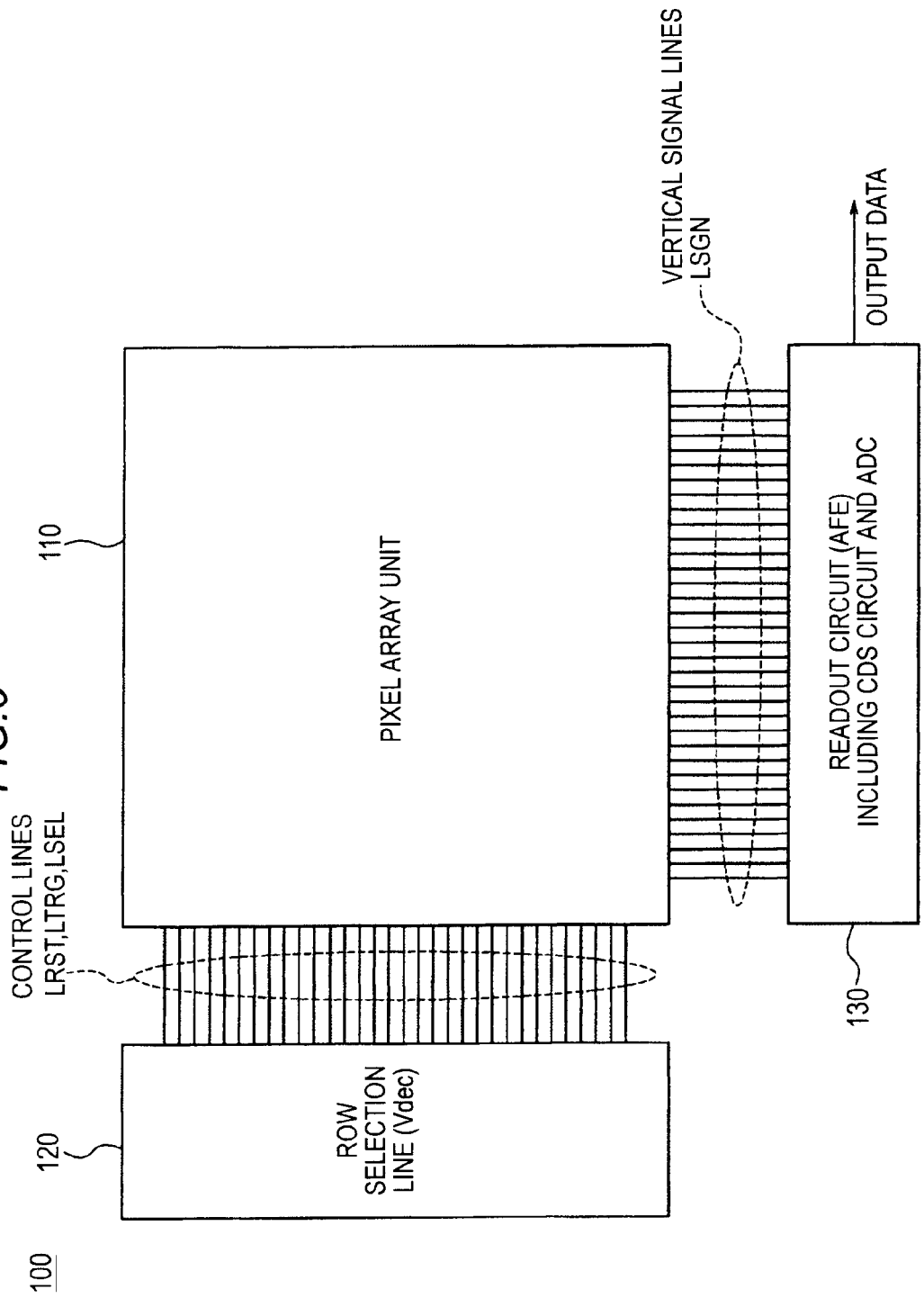

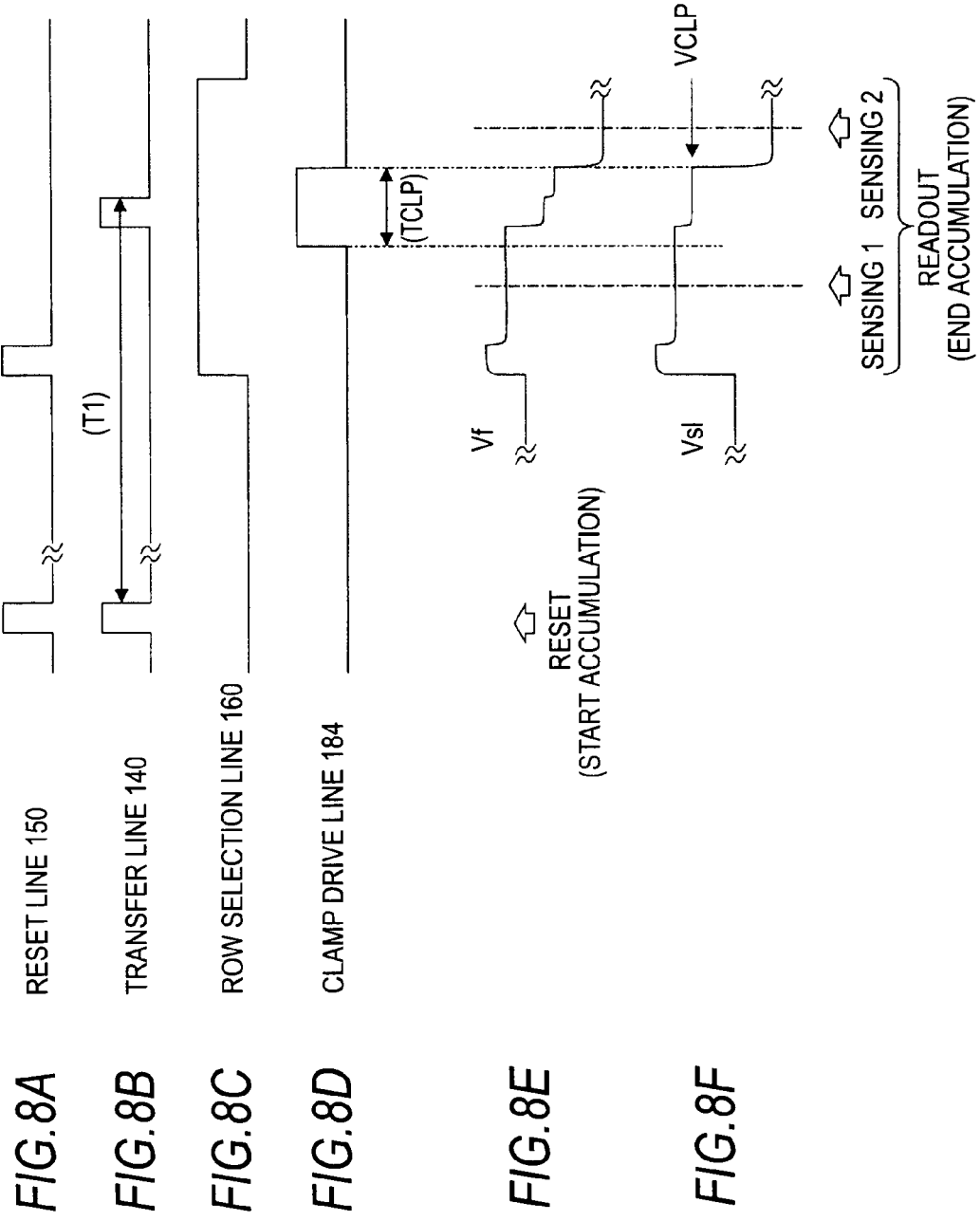

[ST11]

[ST12]

[ST13]

[ST14]

[ST15]

1.5V    3V

PIXEL CIRCUIT, A SOLID-STATE IMAGE SENSING DEVICE, AND A CAMERA SYSTEM THAT FACILITATES CHARGE TRANSFER WITHIN A PIXEL

BACKGROUND OF THE INVENTION

1. Field of the Invention

The present invention relates to a pixel circuit, a solid-state image sensing device, and a camera system represented by a CMOS image sensor.

2. Description of the Related Art

Recently, CMOS imagers have widely been used for application of digital still cameras, camcorders, surveillance cameras, etc., and the market has been growing.

The CMOS imager converts light entering each pixel into electrons using a photodiode as a photoelectric conversion device and accumulates them in a fixed period, and then, digitizes and outputs a signal reflecting the amount of accumulated charge to the outside.

FIG. 1 shows an example of a pixel circuit containing four transistors per unit pixel.

A unit pixel circuit PX1 has a photodiode 1, a transfer transistor 2, a reset transistor 3, an amp transistor 4, a selection transistor 5, an accumulation node 6, and a floating diffusion (FD) node 7.

The gate electrode of the transfer transistor 2 is connected to a transfer line 8, and the gate electrode of the reset transistor 3 is connected to a reset line 9. The gate electrode of the amp transistor 4 is connected to the FD node 7, and the gate electrode of the selection transistor 5 is connected to a row selection line 10. Further, the source of the selection transistor 5 is connected to a vertical signal line 11.

A constant-current circuit 12 and a sensory circuit 13 are connected to the vertical signal line 11.

In the pixel circuit PX, light entering a silicon substrate of the pixel generates a pair of an electron and a hole and the electron of them is collected and accumulated in the node 6 by the photodiode 1. The electron is finally read out as a signal to the vertical signal line 11.

Typically, such pixels are arranged in a matrix in the CMOS imager, and the vertical signal line 11 is shared among plural pixels in the column direction and the transfer line 8, the reset line 9, and the row selection line 10 as gate control lines for turning on/off of the respective transistors are shared among plural pixels in the row direction.

The pixel access is provided collectively in units of rows by driving of the transfer line 8, the reset line 9, and the row selection line 10 as the gate control lines.

The analog signal readout into each vertical signal line 11 is sensed by the sensory circuit 13, AD-converted, and output.

As below, a specific operation of charge accumulation and readout will be explained with reference to FIGS. 2A to 2E.

FIGS. 2A to 2E show a timing chart of the pixel circuit in FIG. 1.

Prior to charge accumulation, resetting is first performed. This turns the reset line 9 and the transfer line 8 into the high level and turns on the reset transistor 3 and the transfer transistor 2. This is an operation of transmitting the power supply voltage of 3 V, for example, to the accumulation node 6 of the photodiode 1.

Thereby, the potential of the accumulation node 6 rises and the electrons accumulated therein are withdrawn.

In a currently predominant HAD (Hole-Accumulation Diode) structure, the accumulation node 6 is formed by an n-type embedded diffusion layer sandwiched between p-type layers, and completely depleted with all of its electrons ejected.

Then, the transfer line 8 is turned into the low level and the transfer transistor 2 is turned off, and thereby, the accumulation node 6 is floated and new charge accumulation is started. During charge accumulation, typically, the reset transistor 3 is also turned off, however, it may be kept on.

Generally, the reset operation of the pixel is used as an electronic shutter operation of the CMOS image sensor.

Next, the readout operation of the accumulated charge will be explained.

First, the row selection line 10 is turned into the high level and the selection transistor 5 is turned on, and the amp transistor 4 of the pixel is connected to the vertical signal line 11.

Here, the vertical signal line 11 and the constant-current circuit 12 connected to the amp transistor 4 form a source-follower circuit, and the potential Vf of the FD node 7 as its input and the potential Vsl of the vertical signal line 11 as its output have a linear relationship with a variation ratio nearly one.

That is, given that the current value of the constant-current circuit 12 is i, the following equation ideally holds.

$$i = (1/2) \times \beta \times (Vf - Vth - Vsl)^2 // \beta \text{ is constant}$$

Here, (Vf−Vth−Vsl) is constant and the variation of Vf is linearly reflected on Vsl.

That is, the source-follower circuit operates as an amp circuit with gain of nearly one, and the potential Vsl of the vertical signal line 11 is modulated to follow the change of the potential Vf of the FD node 7 as the input node.

Here, the reset line 9 is turned into the high level and the reset transistor 3 is turned on, and thereby, the power supply voltage of 3 V is transmitted to the FD node 7.

Further, the reset line 9 is turned into the low level and the reset transistor 3 is turned off, and thereby, the FD node 7 is floated.

Under the condition, the first sensing of the potential Vsl of the vertical signal line 11 is performed using the sensory circuit 13. This is readout of the reset signal.

Then, the transfer line 8 is turned into the high level and the transfer transistor 2 is turned on, and thereby, the electrons accumulated in the accumulation node 6 flow into the FD node 7 as the input node of the source-follower.

In this regard, when the potential of the FD node 7 is sufficiently deep, i.e., a high potential, all of the electrons accumulated in the accumulation node 6 flow into the FD node 7 and the accumulation node 6 is completely depleted.

Here, the transfer line 8 is turned into the low level and the transfer transistor 2 is turned off, and the second sensing of the potential of the vertical signal line 11 is performed using the sensory circuit 13. This is readout of the accumulated signal.

The difference between the first sensing and the second sensing of the Vsl accurately reflects the amount of charge accumulated in the accumulation node 6 through the exposure of the photodiode 1.

The CMOS imager digitizes the difference and outputs it to the outside as a signal value of the pixel. The electron accumulation time of each pixel is a period between the reset operation and the readout operation, and exactly, a period T1 from turning off of the transfer transistor 2 after resetting to turning off for readout.

The more detailed explanation of the behavior of the signal lines is that the potential of the FD node 7 slightly varies due to the influence of coupling when the reset line 9 drops to the low level and the level of the transfer line 8 is raised and lowered. Further, the vertical signal line 11 following that is affected in the same way.

The influence of the coupling from the transfer line 8 is cancelled out between rising and falling, and the influence of the coupling from the reset line 9 is cancelled out by the difference between the first sensing and the second sensing.

In this manner, generally, in the CMOS-type imager, the accumulated electron generated by the photoelectric conversion device is converted into an analog signal of the vertical signal line 11 via the amp circuit with respect to each pixel and transmitted to the sensory circuit 13.

Further, the analog signal is converted into a digital signal by an AD converter and output to the outside of the chip.

This contrasts sharply with a CCD-type imager in which the accumulated electrons themselves are vertically and horizontally transferred by CCD transfer immediately before the amp circuit for chip output.

FIG. 3 shows a circuit configuration of charge transfer from the photodiode 1 to the FD node 7 as the source-follower input node in FIG. 1 by extraction.

At charge accumulation, electrons generated by photoelectric conversion in the photodiode 1 are accumulated in the accumulation node 6 of the photodiode 1.

At readout, they are completely transferred to the FD node 7 as the input of the amp transistor 4 of the source-follower circuit via the transfer transistor 2.

At transfer, the FD node 7 is floated, and has a parasitic capacity 14 for the ground substrate and other wires at fixed potentials.

Given that the amount of accumulated charge is Q and the parasitic capacity value is Cf, the amount of potential change $\Delta Vf$ is as below.

$$\Delta Vf = Q/C$$

An NMOS transistor is typically used for the source-follower circuit as the amp transistor 4, and generates inherent random noise Nr.

Therefore, given that its gain is G, the S/N-ratio of the accumulated signal generated in an output node 15 of the source-follower circuit is $\{G \cdot \Delta Vf/Nr\}$.

Since G and Nr are nearly constant if the parameter of the amp transistor 4 is determined, the magnitude of $\Delta Vf$ directly affects the imaging performance.

FIGS. 4A to 4D show a potential transition with the readout and transfer operation using the pixel circuit as shown in FIG. 1 and FIG. 3.

The potential of each node is shown with the positive potential direction downward and the negative potential direction upward in the drawing. Each node serves as a well for accumulating electrons having negative charge, and, as the well is filled with electrons, the potential rises upward, i.e., in the negative potential direction.

[Step ST1]

At step ST1 in FIG. 4A, the accumulation node 6 as the diffusion node of the photodiode 1 is designed so that the bottom of the potential may be about 1.5 V at its complete depletion by positive charge of a fixed number of donors. Here is filled with photoelectrically converted electrons to a saturated condition (about 0 V).

On the other hand, in the channel region of the transfer transistor 2, its potential is modulated in a range of R1 according to the potential provided to the gate electrode, for example, 1 V to 3 V.

Further, the FD node 7 is reset and floated at 2.7 V. This state is made after the node is reset at 3 V, and then, coupled by 0.3 V when the reset transistor is turned back into the low level.

[Step ST2]

At step ST2 in FIG. 4B, when the transfer transistor 2 is turned on, the every one of electrons accumulated in the accumulation node 6 as the diffusion node of the photodiode 1 moves to the channel region of the transfer transistor 2 and the FD node 7 in a distributed manner.

[Step ST3]

At step ST3 in FIG. 4C, when the transfer transistor 2 is turned off, and therefore, the potential of the channel region rises with the rise of the gate electrode, and the electrons accumulated there move to the FD node 7.

[Step ST4]

At step ST4 in FIG. 4D, when the transfer transistor 2 is off, all of the electrons accumulated in the photodiode 1 at step ST1 move to the FD node 7.

Thereby, the source-follower drives the vertical signal line 11 and performs readout of the accumulated signal.

As described above, to realize complete migration of electrons, it is necessary to secure the potential difference M1 between the completely depleted accumulation node 6 of the photodiode 1 and the FD node 7.

Contrary, if the potential difference M1 is not sufficiently secured, the electrons accumulated in the FD node 7 reversely flow to the photodiode 1, and the amount of accumulated charge of the photodiode 1 is not linearly reflected on the readout signal.

SUMMARY OF THE INVENTION

As described above, for complete transfer of electrons that have been photoelectrically converted at readout, it is necessary that the potential of the FD node 7 after transfer is kept at the higher potential than that of the completely depleted photodiode 1.

However, for the necessity, there are disadvantages that the dynamic range of the potential of the FD node 7 is limited, and it may be impossible to sufficiently raise $\Delta Vf$ or raise the S/N-ratio.

For example, in FIGS. 4A to 4D, the limit of $\Delta Vf$ is (3.0 V–1.5 V), and the potential difference corresponding to the transfer margin is further distracted.

In addition, since the amount of saturated accumulated charge Qs of the photodiode 1 responses to the number of donors within its diffusion layer, typically, as Qs is raised, the potential at complete depletion becomes deeper (the higher potential). This directs the narrower $\Delta Vf$ range.

The problem of transfer margin largely constrains the design.

One means for solving the problem has been proposed in JP-T-2007-535199 by HONG, Sungkwon et al.

HONG, Sungkwon et al. have proposed a configuration in which a preliminary MOS transistor is connected within a pixel and a channel is formed therein, and thereby, the parasitic capacity 14 of the FD node 7 as the input node is temporarily increased at charge transfer.

However, for the purpose, it is necessary to provide an excessive device and an excessive signal line in each pixel, and there is a disadvantage that the aperture ratio of the pixel is reduced.

Thus, it is desirable to provide a pixel circuit, a solid-state image sensing device, and a camera system that can facilitate charge transfer within a pixel, improve amounts of accumulated charge and sensitivity, and improve imaging performance without reducing aperture ratio of the pixel.

A pixel circuit according to one embodiment of the invention has a photoelectric conversion device, a source-follower circuit, a transfer transistor that transfers charge generated in the photoelectric conversion device to an input node of the source-follower circuit, and a readout system that reads out a signal in response to the generated charge through the source-follower circuit, wherein the readout system floats the input node of the source-follower circuit and turns on the transfer transistor to transfer the signal charge to the input node, includes a function of turning off the transfer transistor, sensing an output node potential of the source-follower circuit, and reading out an output signal, and further includes an output modulation degree control function unit that temporarily reduces an output modulation degree of the source-follower circuit when the transfer transistor is turned on.

A solid-state image sensing device according to another embodiment of the invention has a pixel unit in which plural pixel circuits are arranged, and a pixel drive unit that drives the pixel circuits of the pixel unit and reads out pixel signals, wherein each pixel circuit includes a photoelectric conversion device, a source-follower circuit, a transfer transistor that transfers charge generated in the photoelectric conversion device to an input node of the source-follower circuit, and a readout system that reads out a signal in response to the generated charge through the source-follower circuit, and wherein the readout system floats the input node of the source-follower circuit and turns on the transfer transistor to transfer the signal charge to the input node, includes a function of turning off the transfer transistor, sensing an output node potential of the source-follower circuit, and reading out an output signal, and further includes an output modulation degree control function unit that temporarily reduces an output modulation degree of the source-follower circuit when the transfer transistor is turned on.

A camera system according to still another embodiment of the invention has a solid-state image sensing device, an optical system that forms a subject image on the solid-state image sensing device, and a signal processing circuit that processes an output image signal of the solid-state image sensing device, wherein the solid-state image sensing device includes a pixel unit in which plural pixel circuits are arranged, and a pixel drive unit that drives the pixel circuits of the pixel unit and reads out pixel signals, wherein each pixel circuit includes a photoelectric conversion device, a source-follower circuit, a transfer transistor that transfers charge generated in the photoelectric conversion device to an input node of the source-follower circuit, and a readout system that reads out a signal in response to the generated charge through the source-follower circuit, and wherein the readout system floats the input node of the source-follower circuit and turns on the transfer transistor to transfer the signal charge to the input node, includes a function of turning off the transfer transistor, sensing an output node potential of the source-follower circuit, and reading out an output signal, and further includes an output modulation degree control function unit that temporarily reduces an output modulation degree of the source-follower circuit when the transfer transistor is turned on.

According to the embodiments of the invention, charge transfer within a pixel can be facilitated, amounts of accumulated charge and sensitivity can be improved, and imaging performance can be improved without reduction of the aperture ratio of the pixel.

BRIEF DESCRIPTION OF THE DRAWINGS

FIGS. 2A to 2E show a timing chart of the pixel circuit in FIG. 1.

FIG. 5 shows a configuration example of a CMOS image sensor (solid-state image sensing device) employing a pixel circuit according to an embodiment of the invention.

FIGS. 8A to 8F are a timing chart for explanation of an operation of the circuit in FIG. 6.

DESCRIPTION OF PREFERRED EMBODIMENTS

Figure 1:
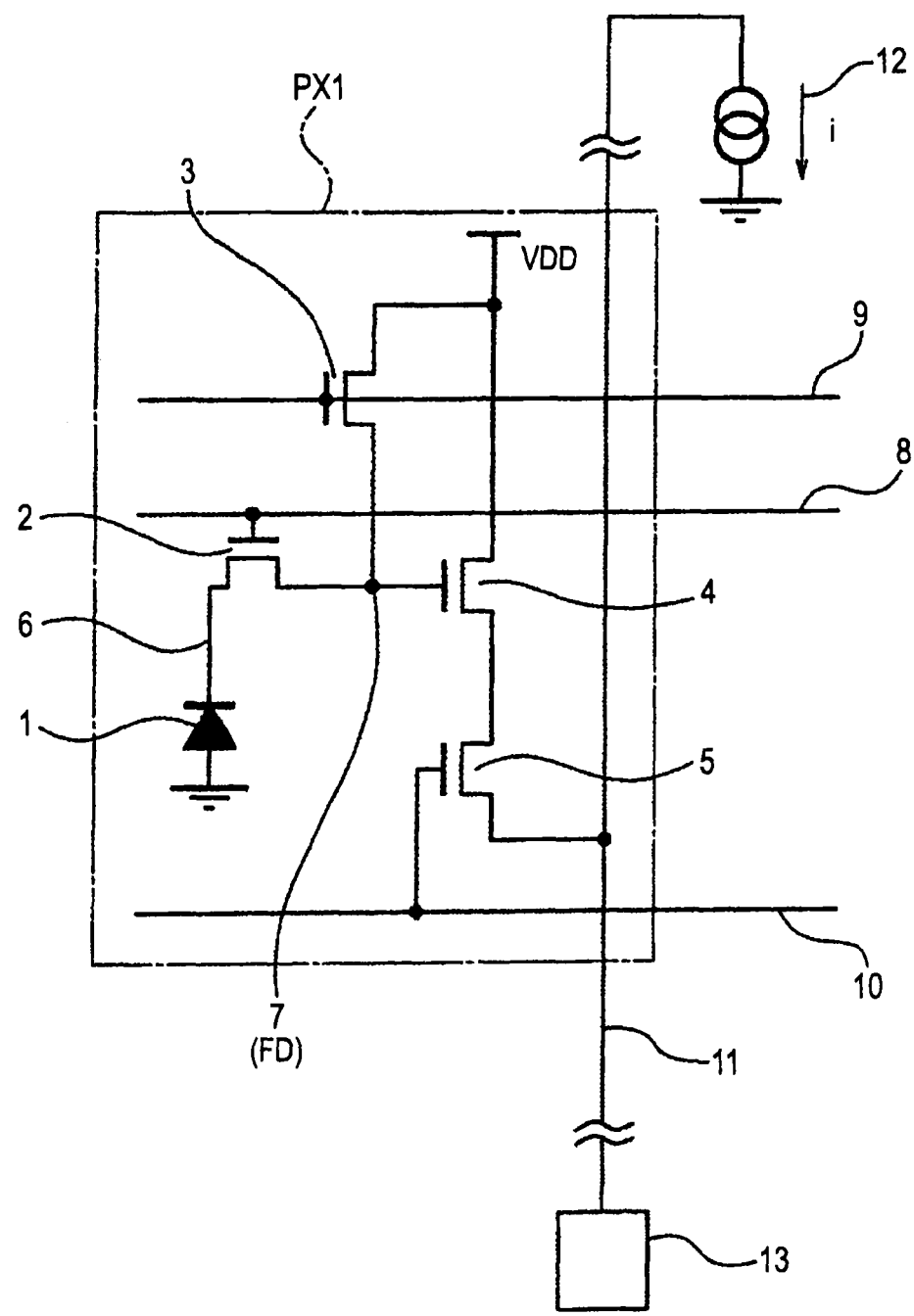
FIG. 1 shows an example of a pixel circuit.
Figure 3:
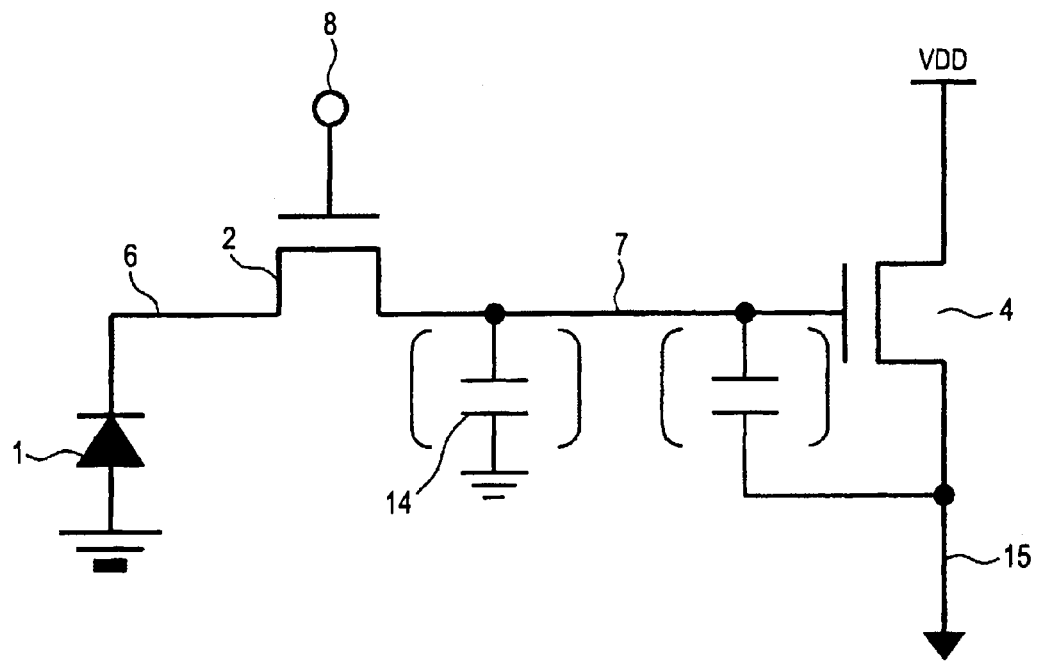
FIG. 3 shows a circuit configuration of charge transfer from a photodiode 1 to an FD node as a source-follower input node in FIG. 1 by extraction.
Figure 4A:
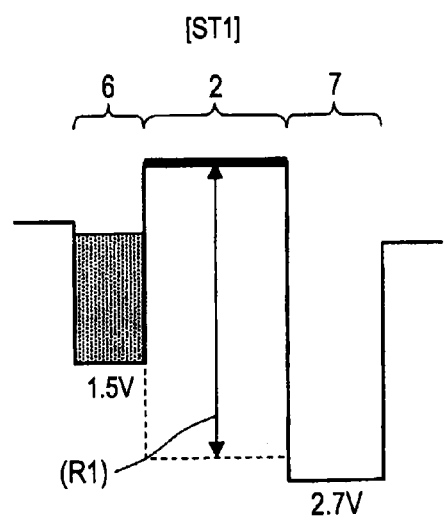
FIGS. 4A to 4D show a potential transition with a readout and transfer operation using the pixel circuit as shown in FIG. 1 and FIG. 3.
Figure 4B:
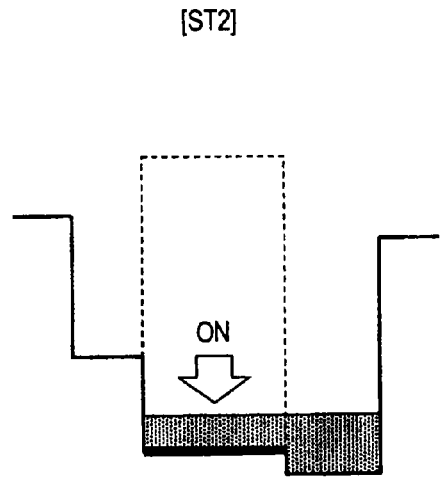
Figure 4C:
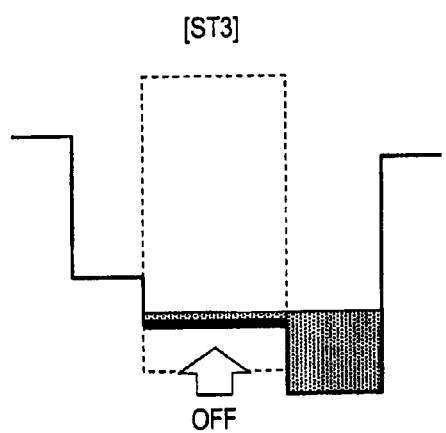
Figure 4D:
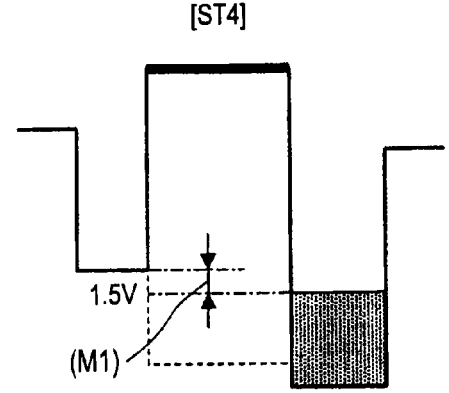

Hereinafter, embodiments of the invention will be explained in detail with reference to the drawings.

The explanation will be made in the following order.
1. First Embodiment (first configuration example of pixel circuit)
2. Second Embodiment (second configuration example of pixel circuit)
3. Third Embodiment (third configuration example of pixel circuit)
4. Fourth Embodiment (fourth configuration example of pixel circuit)
5. Fifth Embodiment (fifth configuration example of pixel circuit)
6. Sixth Embodiment (camera system)

FIG. 5 shows a configuration example of a CMOS image sensor (solid-state image sensing device) employing a pixel circuit according to an embodiment of the invention.

The CMOS image sensor 100 has a pixel array unit 110, a row selection circuit (Vdec) 120 as a pixel drive unit, and a column readout circuit (AFE) 130.

In the pixel array unit 110, plural pixel circuits are arranged in a two-dimensional manner (matrix) of M rows×N columns.

The pixel circuit 110A according to the embodiment basically includes a photoelectric conversion device, a transfer transistor, a reset transistor, an amp transistor, a selection transistor, an accumulation node, and an FD (floating diffusion).

The specific configuration of the pixel circuit 110A will be described in detail later.

A set of a transfer line 140 (LTRG), a reset line 150 (LRST), and a row selection line 160 (LSEL) wired in the pixel array 110 are wired with respect to each row in the pixel arrangement.

M control lines of the respective transfer line 140 (LTRG), reset line 150 (LRST), and row selection line 160 (LSEL) are provided.

These transfer lines 140 (LTRG), reset lines 150 (LRST), and row selection lines 160 (LSEL) are driven by the row selection circuit 120.

The row selection circuit 120 controls the operation of the pixels arranged in an arbitrary row in the pixel array unit 110. The row selection circuit 120 controls the pixel circuit through the transfer line 140 (LTRG), the reset line 150 (LRST), and the row selection line 160 (LSEL).

The column readout circuit 130 receives data of the pixel row readout-controlled by the row selection circuit 120 via a vertical signal line (LSGN) 170, and transfers it to a downstream signal processing circuit. To the vertical signal line 170, a constant-current circuit, a sensory circuit, and a clamp circuit are connected.

The readout circuit 130 includes a CDS circuit and an ADC (analog-digital converter).

As below, the specific configuration example of the pixel circuit in the CMOS image sensor 100 having the above described configuration will be explained.

1. First Embodiment

Figure 6:
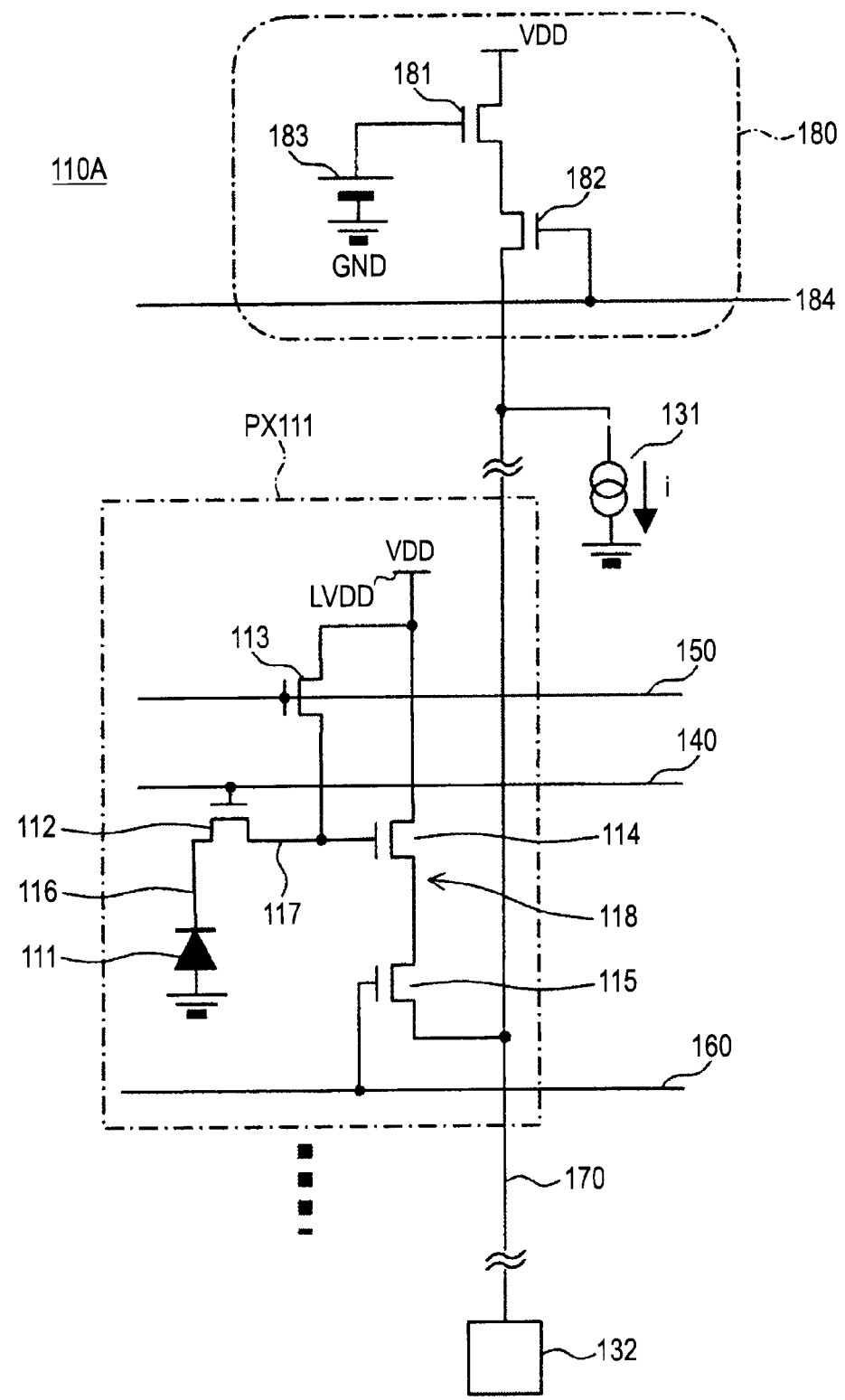
FIG. 6 shows a pixel circuit of a CMOS image sensor according to a first embodiment of the invention.

FIG. 6 shows a pixel circuit of a CMOS image sensor according to the first embodiment of the invention.

In the pixel circuit 110A in FIG. 6, the configuration unit shown by a dotted line is a unit pixel circuit PX111.

The unit pixel circuit PX111 has a photodiode 111 as a photoelectric conversion device, a transfer transistor 112, a reset transistor 113, an amp transistor 114, a selection transistor 115, an accumulation node 116, and an FD node 117.

The amp transistor 114 forms an amp circuit 118, and the FD node 117 forms the input node of the amp circuit 118.

The transfer transistor 112 of the first embodiment is connected between the photodiode 111 and the FD node 117 as the output node. The gate electrode of the transfer transistor 112 is commonly connected to the transfer line 140.

The reset transistor 113 is connected between a power supply line LVDD and the FD node 117 and the gate electrode is connected to the reset line 150.

The gate of the amp transistor 114 is connected to the FD node 117. The amp transistor 114 is connected to the vertical signal line 170 via the selection transistor 115, and forms a constant-current circuit 131 and a source-follower outside of the unit pixel.

The gate electrode of the selection transistor 115 is connected to the row selection line 160. Further, the source of the selection transistor 115 is connected to the vertical signal line 170.

To the vertical signal line 170, the constant-current circuit 131, a sensory circuit 132, and a clamp circuit 180 are connected.

A readout system includes, for example, the vertical signal line 170, the constant-current circuit 131, the sensory circuit 132, the clamp circuit 180, etc.

The clamp circuit 180 has an output modulation degree control function of temporarily reducing the output modulation degree of the source-follower circuit when the transfer transistor 112 is turned on.

In the unit pixel circuit PX111 of the pixel circuit 110A having the above described configuration, light entering a silicon substrate of the pixel generates a pair of an electron and a hole and the electron of them is collected and accumulated in the node 116 by the photodiode 111.

The electron is finally read out as a signal to the vertical signal line 170.

In a CMOS imager, those pixels are arranged in a matrix and the vertical signal line 170 is shared among the plural pixels in the column direction and the transfer line 140, the reset line 150, and the row selection line 160 as gate control lines for turning on/off of the respective transistors are shared among the plural pixels in the row direction.

Pixel access is performed collectively in units of rows by driving the transfer line 140, the reset line 150, and the row selection line 160 as the gate control lines.

The analog signal read out by each vertical signal line 170 is sensed by the sensory circuit 132, AD-converted, and output.

On the other hand, one clamp circuit 180 is provided with respect to each column.

The clamp circuit 180 includes a clamp transistor 181 connected to a power supply and a selection transistor 182.

The gate electrode of the clamp transistor 181 is connected to a bias power supply 183, and the gate electrode of the selection transistor 182 is connected to a clamp drive line 184. Note that the clamp drive line 184 is driven by the row selection circuit 120, for example. The drive system of the clamp drive line 184 may separately be provided from the row selection circuit 120.

The selection transistor 182 is turned on when the clamp drive line 184 is at the high level and enables the clamp circuit 180.

The gate of the clamp transistor 181 is set at a fixed potential so that the vertical signal line 170 may be clamped at an appropriate level.

The function of the clamp circuit 180 is to clamp the vertical signal line 170 so that its potential may not drop below the fixed potential when the clamp drive line 184 is at the high level.

The clamp circuit 180 is employed as an example of an output modulation degree control function unit that temporarily reduces the output modulation degree of the source-follower circuit when the transfer transistor 112 is turned on.

Here, a basic concept of providing an output modulation degree control function unit according to the embodiment will be explained.

Figure 7:
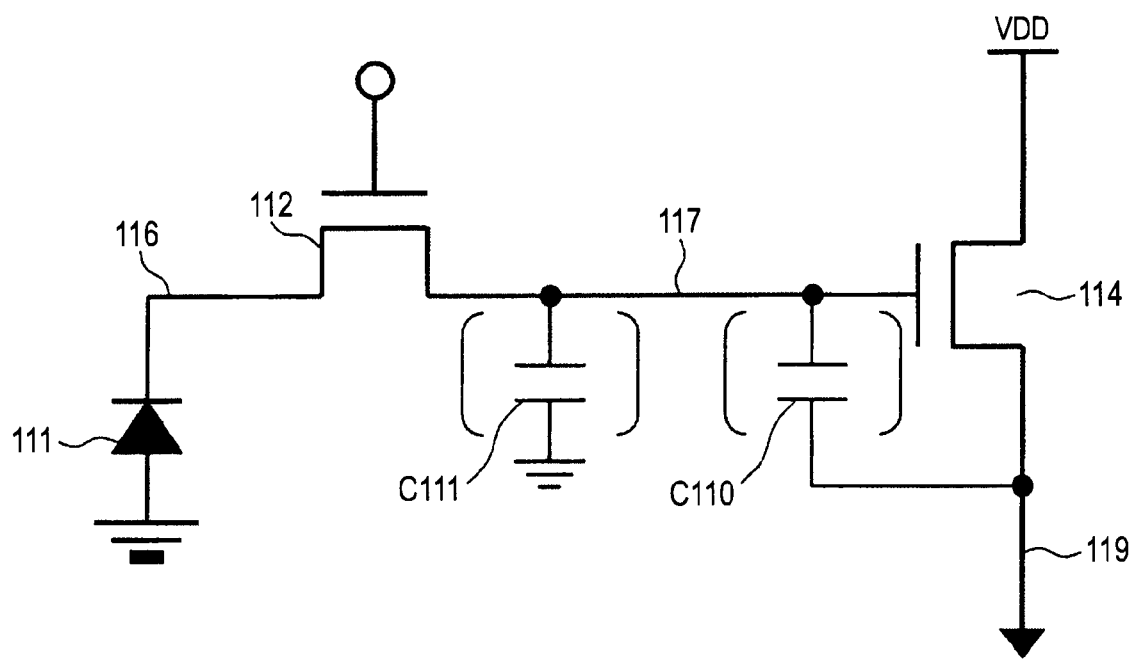
FIG. 7 is a diagram for explanation of a basic concept of providing an output modulation degree control function unit according to the embodiment.

FIG. 7 is a diagram for explanation of the basic concept of providing the output modulation degree control function unit according to the embodiment.

FIG. 7 shows a circuit configuration of charge transfer from the photodiode 111 to the FD node 117 as the source-follower input node in FIG. 6 by extraction.

In the embodiment of the invention, attention is focused on the fact that the effective parasitic capacity of the FD node 117 in FIG. 7 varies due to the state of the source-follower circuit itself, and the optimum capacity control is realized by the output modulation degree control function unit without addition of a new device with respect to each pixel.

The basic concept is as below.

That is, in the FD node 117, a channel capacity of the amp transistor 114 of NMOS forming the source-follower and a wiring capacity between the output wiring of the source follower and itself exist. Because of the existence of the capacities, a significant coupling capacity C110 is formed between the output node 119 of the source-follower and itself.

However, the output node 119 of the source-follower is modulated in the same direction nearly by the same potential (with gain of nearly "1") relative to the potential variation of the FD node 117 as the input thereof, and thus, most of the coupling capacities of them are not effectively added to the parasitic capacity C111.

By taking advantage of the inverse phenomenon to suppress the modulation of the output node 119 of the source-follower when the potential of the FD node 117 varies, the parasitic capacity C111 is enabled and the total parasitic capacity of the FD node 117 can temporarily be increased.

Thereby, the potential variation of the FD node 117 at charge transfer within pixel can temporarily be reduced and the transfer margin can significantly be raised.

By employing the configuration, the spare potential at transfer can significantly be improved and good linearity can be maintained in the wide signal fluctuation range. Thereby, the dynamic range of the signal can be improved by raising Qs or reducing the parasitic capacity of the FD node.

The modulation control of the output node of the source-follower circuit may be performed via the vertical signal line 170 connected to the plural source-follower circuits, and therefore, it is not necessary to add a circuit with respect to each unit pixel.

Next, an operation of the circuit having the clamp circuit 180 in FIG. 6 will be explained.

FIGS. 8A to 8F are a timing chart for explanation of an operation of the circuit in FIG. 6.

FIG. 8A shows the level of the reset line 150, FIG. 8B shows the level of the transfer line 140, FIG. 8C shows the level of the row selection line 160, respectively. FIG. 8D shows the level of the clamp drive line 184, FIG. 8E shows the potential Vf of the FD node 117, and FIG. 8F shows the level of the vertical signal line 170, respectively.

Prior to charge accumulation, reset of the pixel is performed. The reset turns the reset line 150 and the transfer line 140 into the high level and turns on the reset transistor 113 and the transfer transistor. Thereby, the potential of the accumulation node 116 rises and the electrons accumulated therein are withdrawn.

Then, the transfer line 140 is turned into the low level and the transfer transistor 112 is turned off, and thereby, the accumulation node 116 is floated and new charge accumulation is started.

Next, a readout operation of the accumulated charge will be explained.

First, the row selection line 160 is turned into the high level and the selection transistor 115 is turned on, and the amp transistor 114 of the unit pixel is connected to the vertical signal line 170.

Here, the vertical signal line 170 and the constant-current circuit 131 connected to the amp transistor 114 form a source-follower circuit, and the potential Vf of the FD node 117 as its input and the potential Vsl of the vertical signal line 170 as its output have a linear relationship with a variation ratio nearly one.

Here, the reset line 150 is turned into the high level and the reset transistor 113 is turned on, and thereby, the power supply voltage VDD, i.e., 3 V is transmitted to the FD node 117.

Further, the reset line 150 is turned into the low level and the reset transistor 113 is turned off, and then, the first sensing of the potential Vsl of the vertical signal line 170 is performed using the sensory circuit 132 including a comparator, an AD converter, etc.

This is readout of the reset signal. After the reset transistor 113 is turned off, the FD node 7 is floated.

Furthermore, the clamp drive line 184 is turned into the high level and the clamp circuit 180 is connected to the vertical signal line 170.

Here, the clamp level is set to a potential slightly higher than the reset level of the vertical signal line 170, and, at this point, the behavior of the vertical signal line 170 and the FD node 117 is the same as in the case of FIG. 1.

Then, the transfer line 140 is turned into the high level and the transfer transistor 112 is turned on, and thereby, the electrons accumulated in the accumulation node 116 flow into the FD node 117.

In this regard, during TCLP in which the vertical signal line 170 is clamped and the clamp drive line 184 is at the high level, its potential is clamped to the level of VCLP.

Thereby, the coupling capacity C110 with the output node 119 of the source-follower circuit shown in FIG. 7 is added to the parasitic capacity C111 of the FD node 117, and the potential fluctuation range of the FD node 117 becomes smaller by that amount.

Further, the transfer line 140 is turned into the low level and the transfer transistor 112 is turned off, and then, the clamp drive line 184 is turned into the low level and the clamp circuit 180 is separated from the vertical signal line 170. In this regard, the potential of the not clamped clamp drive line 184 becomes lower and the potential of the FD node 117 also becomes lower.

Finally, the second sensing of the potential of the vertical signal line 170 is performed using the sensory circuit 132. This is readout of the accumulated signal.

The difference between the first sensing and the second sensing of the Vsl accurately reflects the amount of charge accumulated in the accumulation node 116 through the exposure of the photodiode 111.

The CMOS imager digitizes the difference and outputs it to the outside as a signal value of the pixel. The electron accumulation time of each pixel is a period between the reset operation and the readout operation, and exactly, a period T1 from turning off of the transfer transistor after resetting to turning off for readout.

FIGS. 9A to 9D and FIG. 10 are diagrams showing a potential transition with the readout and transfer operation using the transfer circuit of the pixel circuit according to the first embodiment.

In FIGS. 9A to 9D and FIG. 10, the potential of each node is shown with the positive potential direction downward and the negative potential direction upward in the drawing.

Each node serves as a well for accumulating electrons having negative charge, and, as the well is filled with electrons, the potential rises upward, i.e., in the negative potential direction.

[Step ST11]

Figure 9A:
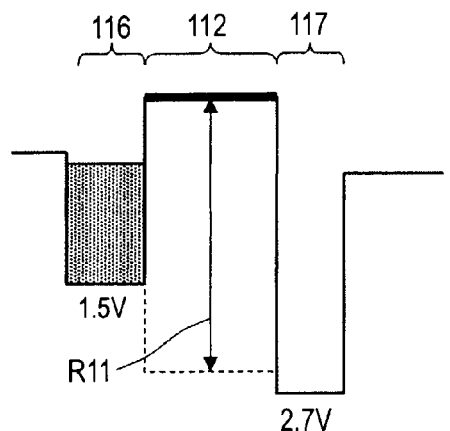
FIGS. 9A to 9D are first diagrams showing a potential transition with a readout and transfer operation using a transfer circuit of the pixel circuit according to the first embodiment.

At step ST11 in FIG. 9A, the accumulation node 116 as the diffusion node of the photodiode 111 is designed so that the bottom of the potential may be about 1.5 V at its complete depletion by positive charge of a fixed number of donors. Here is filled with photoelectrically converted electrons to a saturated condition (about 0 V).

On the other hand, in the channel region of the transfer transistor 112, its potential is modulated in a range of R11 according to the potential provided to the gate electrode (for example, 1 V to 3 V).

Further, the FD node 117 is reset and floated at 2.7 V.

This state is made after the node is reset at 3 V, and then, coupled by 0.3 V when the reset line 150 is turned back into the low level.

[Step ST12]

Figure 9B:
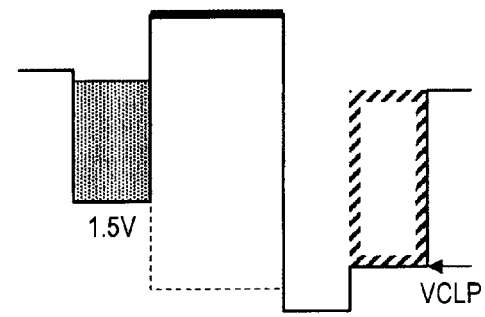

At step ST12 in FIG. 9B, the clamp drive line 184 is turned into the high level and the clamp circuit 180 is connected to the vertical signal line 170.

Then, at the shallower potential side than the clamp level VCLP (the lower potential side), the coupling capacity C110 between the FD and the output node 119 of the source-follower circuit is added to the parasitic capacity C111 of the FD node 117.

The drawing conceptually shows the increase of the FD capacity.

[Step ST13]

Figure 9C:
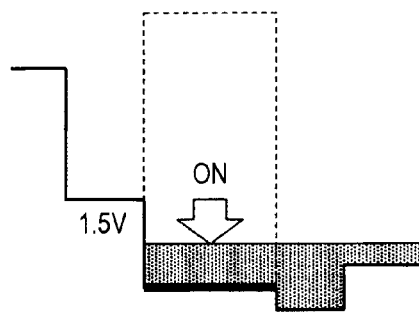

At step ST13 in FIG. 9C, when the transfer transistor 112 is turned on, the every one of electrons accumulated in the accumulation node 116 of the photodiode 111 moves to the channel region of the transfer transistor 112 and the FD node 117 in a distributed manner.

[Step ST14]

Figure 9D:
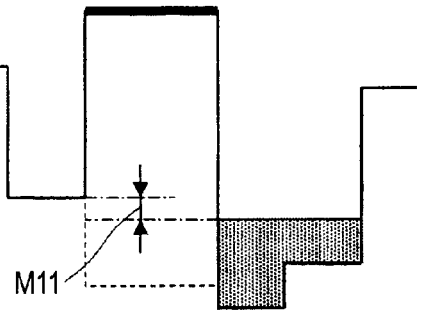

At step ST14 in FIG. 9D, when the transfer transistor 112 is turned off, all of the electrons accumulated in the photodiode 111 at steps ST11 and ST12 move to the FD node 117.

As described above, to realize complete migration of electrons, it is necessary to secure the potential difference M1 between the completely depleted accumulation node 116 of the photodiode 111 and the FD node 117.

[Step ST15]

Figure 10:
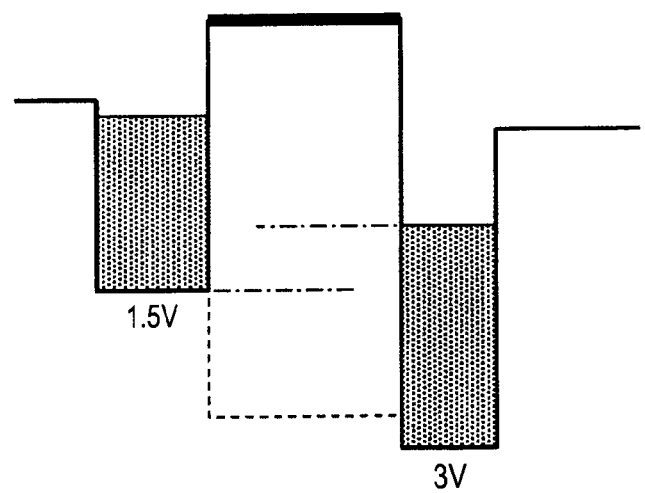
FIG. 10 is a second diagram showing the potential transition with the readout and transfer operation using the transfer circuit of the pixel circuit according to the first embodiment.

At step ST15 in FIG. 10, the clamp drive line 184 is turned into the low level and the clamp circuit 180 is separated from the vertical signal line 170.

Then, the coupling capacity C110 between the FD node 117 and the output node 119 of the source-follower circuit disappears and the potential of the FD node 117 transits to the shallower (lower potential) state.

At this point, the transfer transistor 112 has already been closed, and it may not be problematic that the final potential of the FD node 117 is lower than the potential of the photodiode 111.

That is, the margin of charge transfer is improved by the amount of potential fluctuation range of the FD node 117 at step ST15.

Thereby, the source-follower drives the vertical signal line 170 and readout of the accumulated signal is performed.

When the above described transfer is performed, it is not necessary to secure the potential difference between the completely depleted accumulation node 116 of the photodiode 111 and the FD node 117 at readout. If the potential of the FD node 117 filled with electrons is shallower than that of the accumulation node 116, complete transfer has been completed, and therefore, the signal obtains good linearity in a wide range.

And now, for the setting of the clamp level VCLP in the working example, it is desirable to take the following consideration.

In imaging in the dark with no signal, very slight noise is problematic.

Therefore, when the transfer transistor 112 is turned on in the dark, it is not desirable that a strong channel to be a noise source is formed under its gate. For this, it is desirable that the FD node 117 is subjected to coupling from the transfer line 140 and its potential transits toward deeper.

However, if the capacity increase of the FD node 117 has occurred by clamping at this point, the FD node 117 becomes hard to be subjected to the coupling and does not move to the sufficiently deep potential.

Therefore, it is desirable that the clamp level of the output node 119 of the source-follower circuit is set slightly lower than the reset level (shallower as a potential) and it is better that the clamp has not started for readout in the dark without accumulated charge.

On the other hand, at the maximum output as a sensory limit, naturally, there is little point unless the clamping has been performed.

That is, regarding the relationship between the clamp potential VCLP and the signal output level from the source-follower, it is desirable that the clamp potential VCLP is set between the output level in the dark and the output level at the maximum output and slightly lower than the output level in the dark.

And now the embodiments of the invention may be applied to any image sensor that has a signal transfer form as shown in FIG. 7.

That is, the charge signal photoelectrically converted in each pixel is transferred to the FD node 117 as the input node of the source-follower circuit via the transfer transistor 112 for readout.

Further, to an imager having a form to be transmitted to the readout circuit as potential modulation of the output node 119 of the source-follower circuit, the embodiments of the invention may be applied regardless of component elements of pixels.

As below, some examples of pixel configurations to which the embodiments of the invention may be applied will be shown.

[Another Configuration Example of Pixel Circuit (Shared Pixels)]

Figure 11:
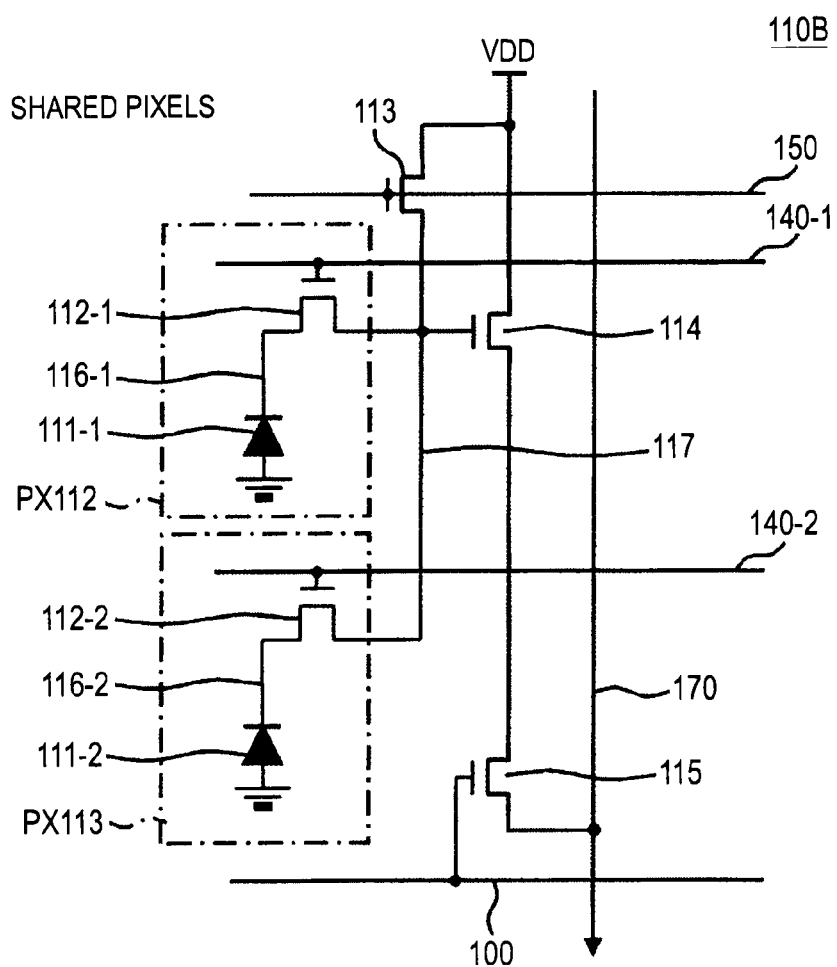
FIG. 11 is a circuit diagram showing another configuration example (shared pixel configuration) of the pixel circuit according to the embodiment.

FIG. 11 is a circuit diagram showing another configuration example (shared pixel configuration) of the pixel circuit according to the embodiment.

In a pixel circuit 110B in FIG. 11, two pixels PX112, PX113 share the amp transistor 114 forming the source-follower, and further share the reset transistor 113 and the selection transistor 115.

The pixel PX112 includes a photodiode 111-1, a transfer transistor 112-1, and an accumulation node 116-1.

The pixel PX113 includes a photodiode 111-2, a transfer transistor 112-2, and an accumulation node 116-2.

The shared units of two pixels are arranged in a matrix and plural units share the vertical signal line 170.

When the transfer transistor 112-1 or 112-2 connected to the selected pixel is turned on, the transfer margin can be enlarged by temporarily clamping the vertical signal line 170.

Further, the shared-type pixels may have a function, by turning on the transfer transistor 112-1 and 112-2 at the same time, of reading out charge from both pixels PX112, PX113 at the same time and summing the both signals on the shaped FD node 117.

In this case, the FD node receives twice as much charge as normal charge and the output signal can potentially obtain the doubled dynamic range. Note that, previously, it has been impossible to ensure only the same dynamic range as that without summation due to the restrictions of the potential.

However, by employing the embodiments of the invention, it may be possible to ensure the larger dynamic range than that without summation.

[Another Configuration Example of Pixel Circuit (3Tr-Type Pixel)]

Figure 12:
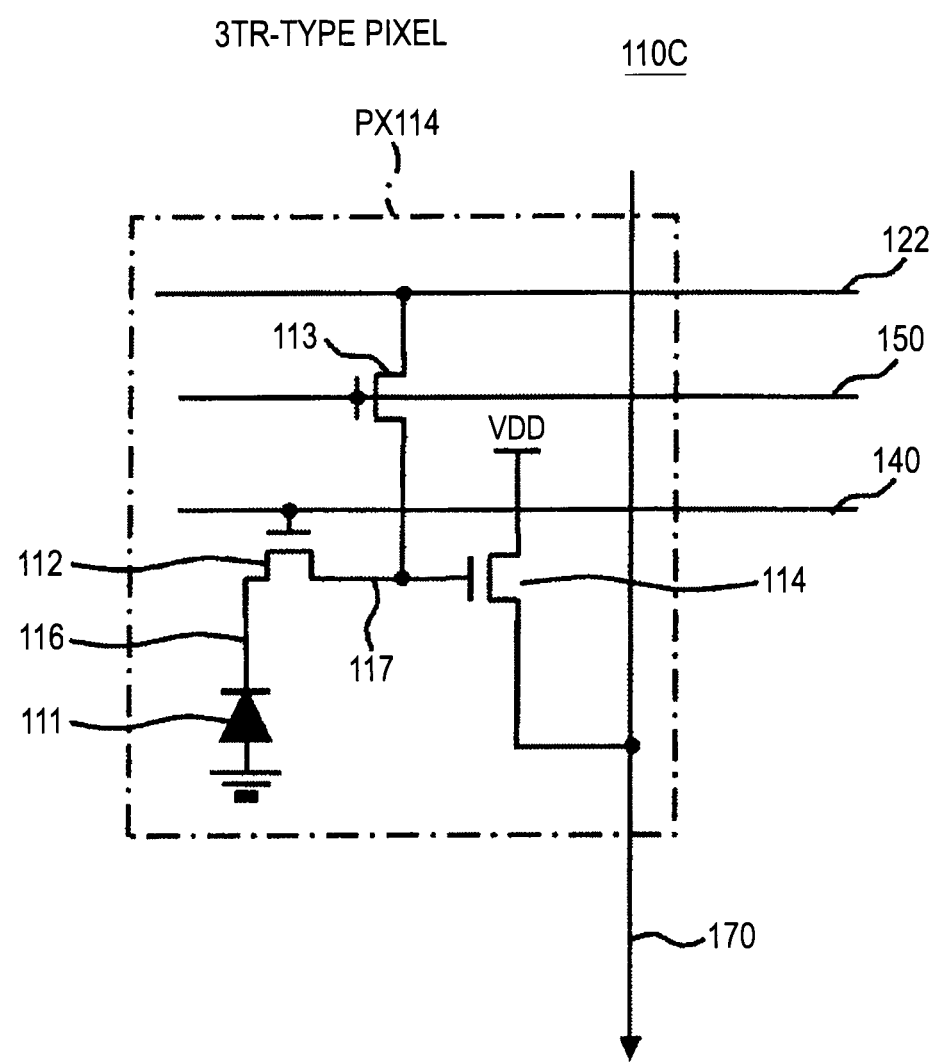
FIG. 12 is a circuit diagram showing another configuration example (3Tr-type pixel) of the pixel circuit according to the embodiment.

FIG. 12 is a circuit diagram showing another configuration example (3Tr-type pixel) of the pixel circuit according to the embodiment.

In a unit pixel PX114 of the pixel circuit 110C, the selection transistor is removed from the configuration in FIG. 6. Further, in the pixels in the non-selected row, the reset transistor 113 is turned on while a reset power supply 122 is dropped to 0 V, and thereby, the amp transistor 114 as the source-follower is turned off.

Such pixels are arranged in a matrix and plural pixels share the vertical signal line 170.

When the pixel (PX) is selected and the transfer transistor 112 is turned on, the transfer margin can be enlarged by temporarily clamping the vertical signal line 170.

The clamping of the vertical signal line is one of the optimum methods of the output modulation degree control function unit for suppressing the amount of modulation of the source-follower output, and, in this case, any noise due to fluctuation of the power supply voltage is not generated because there is no current variation of the vertical signal line.

Further, by starting clamping from the slightly lower potential than the reset level, no adverse effect of generating extra noise occurs in the dark. Since the vertical signal line is shared among plural source-followers, the circuit size is hardly increased.

However, in addition, plural methods can be applied to modulation suppression of the source-follower output.

If the methods are largely categorized, one of them is to connect the source-follower output to another fixed voltage source. In this regard, the source-follower output is drawn by the fixed voltage source, and the amount of modulation becomes lower or any modulation is not performed.

The connection to the clamp circuit is an example of them, there are some other similar methods, and the examples will be shown as the second to fifth embodiments as below.

2. Second Embodiment

Figure 13:
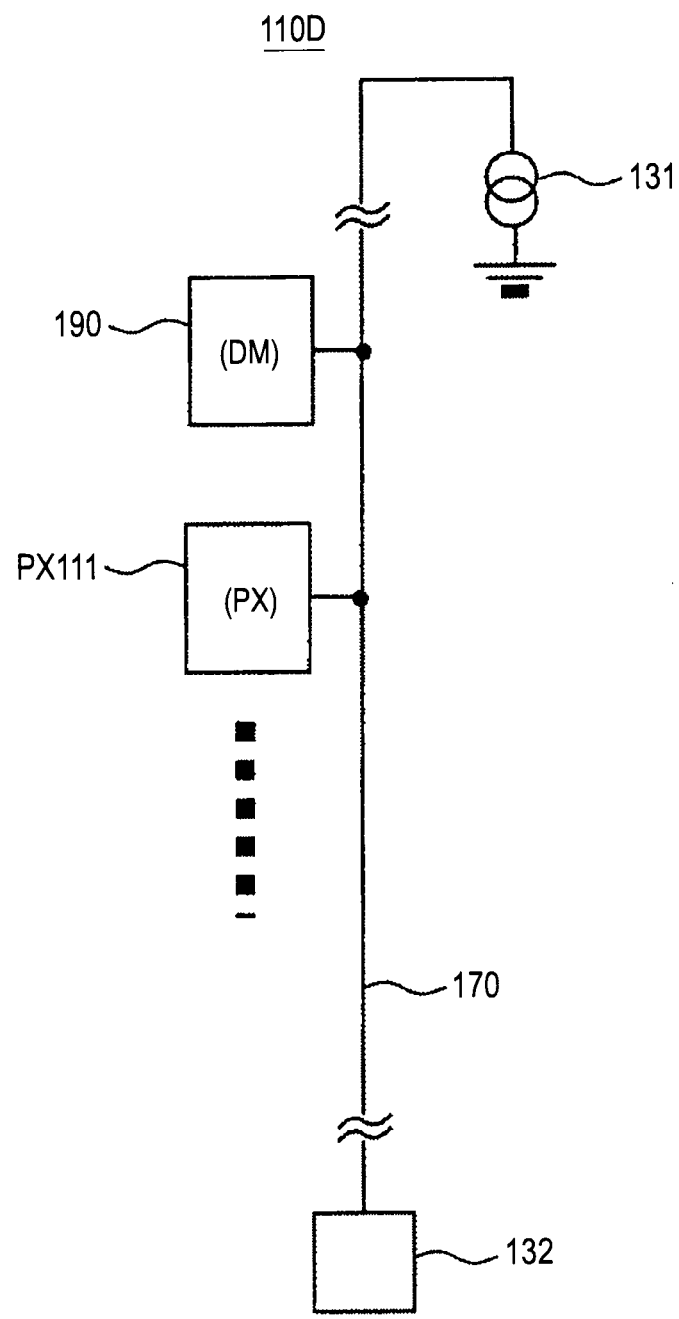
FIG. 13 shows a pixel circuit of a CMOS image sensor according to a second embodiment of the invention.

FIG. 13 shows a pixel circuit of a CMOS image sensor according to the second embodiment of the invention.

A pixel circuit 110D according to the second embodiment is different from the pixel circuit 110A according to the first embodiment in the following point.

That is, in the pixel circuit 110D, to the vertical signal line 170, for example, not the clamp circuit, but a dummy pixel 190 at the reset level is connected.

According to the second embodiment, a similar effect to that in the above described first embodiment can be obtained.

In the pixel circuit 110D, to the vertical signal line 170, the source-follower output of the dummy pixel (DM) 190 is temporarily connected in addition to the source-follower output of the selected pixel PX111.

The dummy pixel (DM) 190 has the same internal configuration as that of the unit pixel PX111 shown in FIG. 6, for example, in which the transfer transistor 112 is constantly off and the reset transistor 113 is constantly on.

The selection transistor 115 is temporarily turned on over a period in which the selected pixel PX111 performs internal charge transfer for readout, and connects the dummy pixel (DM) 190 to the vertical signal line 170.

In this regard, the vertical signal line 170 is connected to the power supply via the amp transistor 114 of the dummy pixel (DM) 190.

3. Third Embodiment

Figure 14:
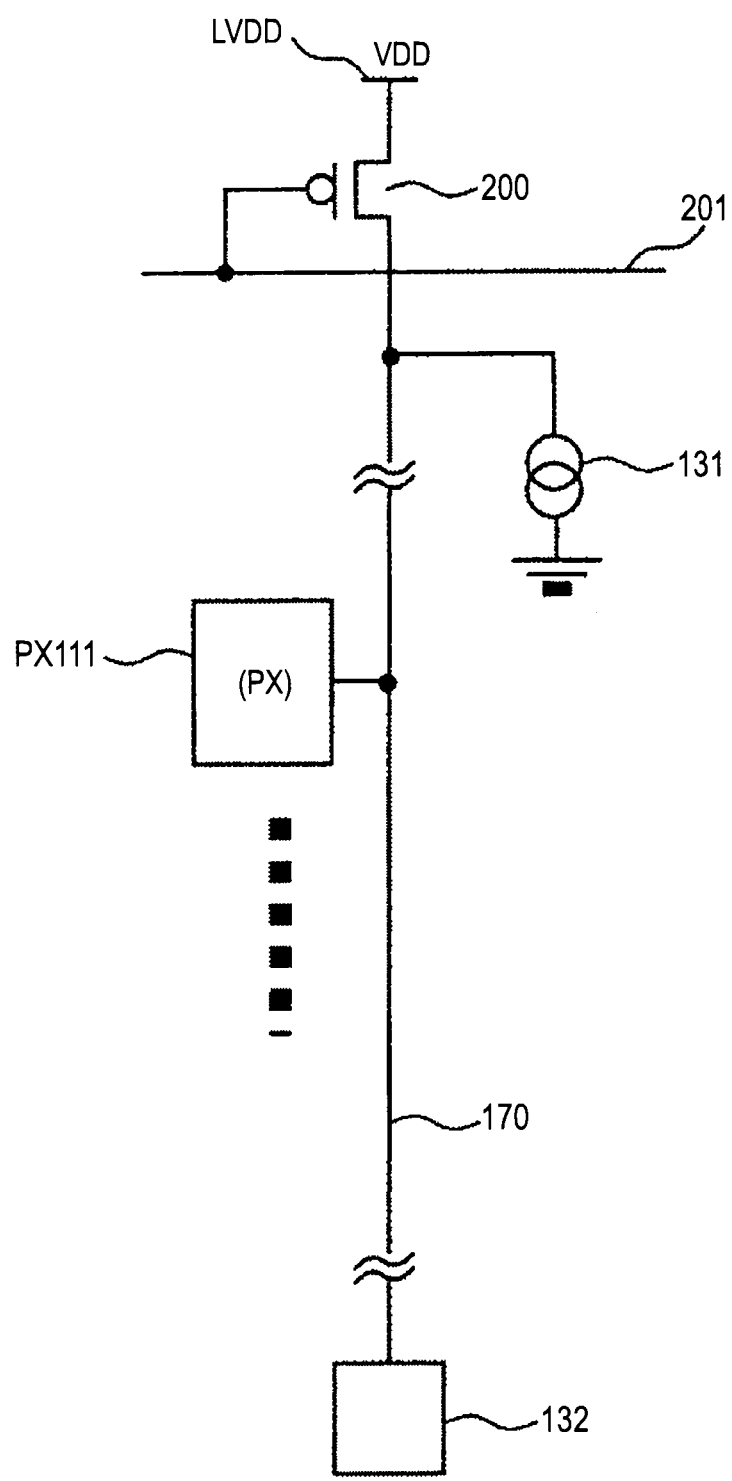
FIG. 14 shows a pixel circuit of a CMOS image sensor according to a third embodiment of the invention.

FIG. 14 shows a pixel circuit of a CMOS image sensor according to the third embodiment of the invention.

A pixel circuit 110E according to the third embodiment is different from the pixel circuit 110A according to the first embodiment in the following point.

That is, in the pixel circuit 110E, the source-follower output itself can be fixed to the power supply voltage VDD via a switch device 200.

In this example, the switch device 200 is formed by a PMOS transistor, and its drain is connected to the vertical signal line 170, the source is connected to the power supply line LVDD, and the gate electrode is connected to a power supply connection line 201.

The power supply connection line 201 is switched from the high level to the low level over the period in which the selected pixel PX111 performs internal charge transfer for readout.

Thereby, the switch device 200 as the PMOS transistor is temporarily turned on, and the vertical signal line 170 is connected to the power supply and its potential is boosted to the power supply voltage VDD.

4. Fourth Embodiment

Figure 15:
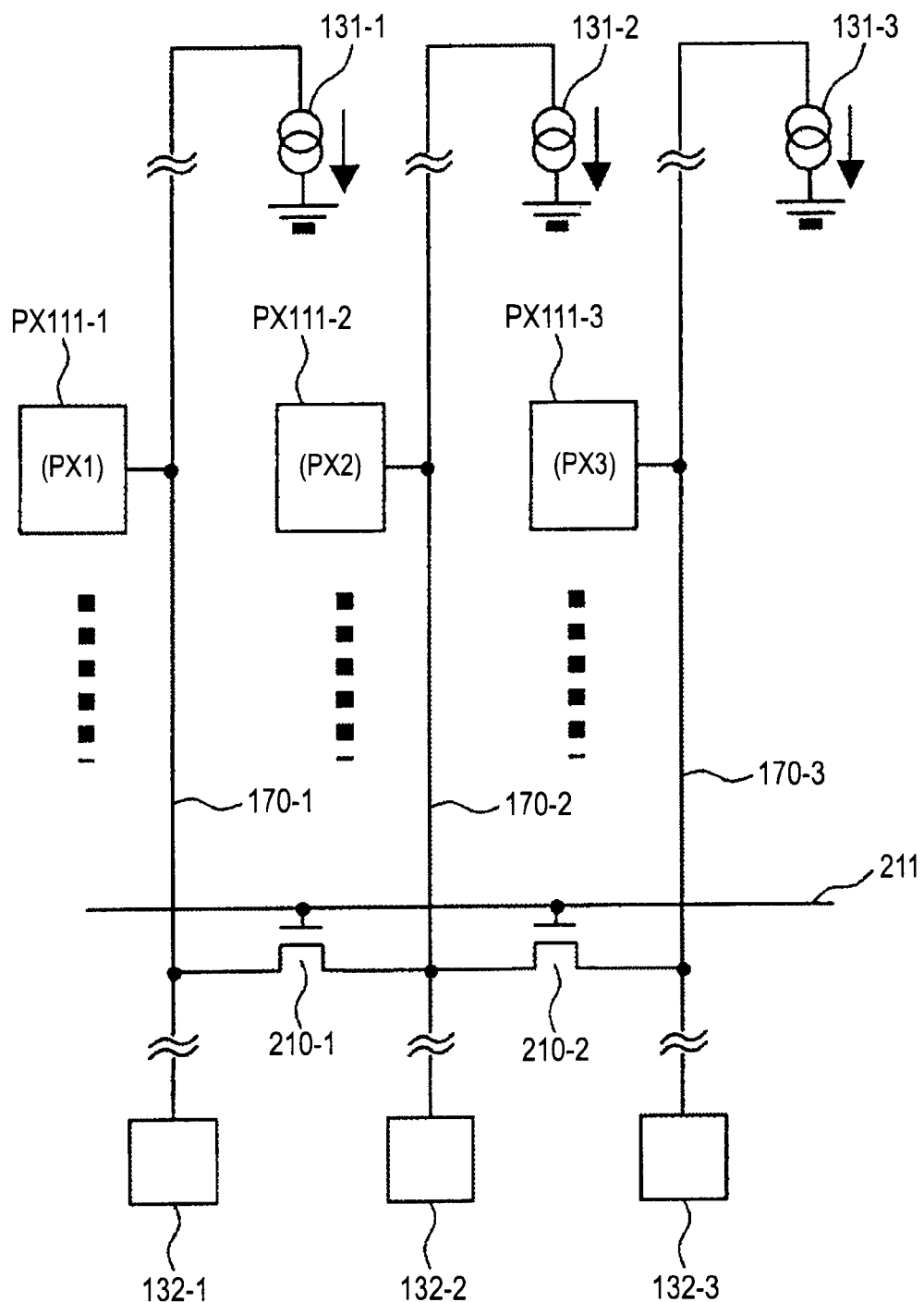
FIG. 15 shows a pixel circuit of a CMOS image sensor according to a fourth embodiment of the invention.

FIG. 15 shows a pixel circuit of a CMOS image sensor according to the fourth embodiment of the invention.

A pixel circuit 110F according to the fourth embodiment is different from the pixel circuit 110A according to the first embodiment in the following point.

That is, in the pixel circuit 110F, the source-follower output of each of the unit pixels PX111-1, PX111-2, PX111-3, ... can be shorted between the adjacent vertical signal lines 170-1 and 170-2, 170-2 and 170-3.

Specifically, switch devices 210-1, 210-2, ... are connected between the vertical signal lines 170-1 and 170-2, between 170-2 and 170-3.

In this example, the switch devices 210-1, 210-2, ... are formed by NMOS transistors and their drains and sources are connected to the vertical signal lines 170-1 and 170-2, 170-2 and 170-3, and the gate electrodes are connected to an interconnection line 211.

In the example, the interconnection line 211 is switched from the low level to the high level over the period in which the selected pixels PX111-1, PX111-2, PX-111-3 each performs internal charge transfer for readout. Thereby, the respective vertical signal lines 170-1 and 170-2, 170-2 and 170-3 are shorted.

In this regard, the vertical signal line 170 in the large amount of modulation connected to the pixel with a large signal is drawn by the other vertical signal line 170 connected to the pixel with a small signal, and its modulation degree becomes lower.

Therefore, the capacity increase effect of the FD node 117 appears only for the pixel with the large signal.

5. Fifth Embodiment

Figure 16:
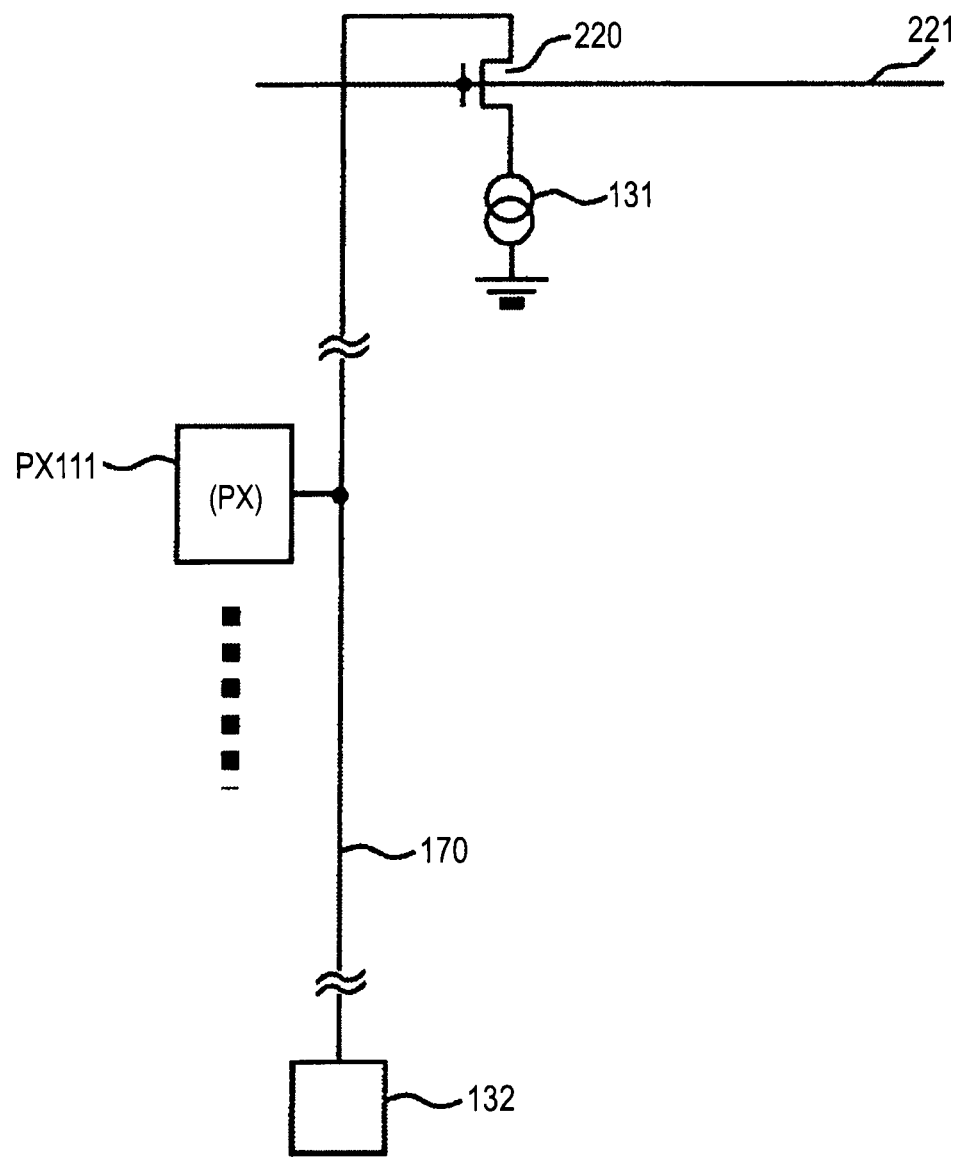
FIG. 16 shows a pixel circuit of a CMOS image sensor according to a fifth embodiment of the invention.

FIG. 16 shows a pixel circuit of a CMOS image sensor according to the fifth embodiment of the invention.

A pixel circuit 110G according to the fifth embodiment is different from the pixel circuit 110A according to the first embodiment in the following point.

That is, in the pixel circuit 110G, modulation suppression of the source-follower output can be realized also by separating the vertical signal line 170 from the constant-current circuit 131 via a switch 220 into a floated condition.

In this example, the switch device 220 is formed by an NMOS transistor, its drain is connected to the vertical signal line 170, the source is connected to the constant-current circuit 131, and the gate electrode is connected to a constant-current circuit connection line 221.

In the example, the constant-current circuit connection line 221 is switched from the high level to the low level over the period in which the selected pixel PX111 performs internal charge transfer for readout, and thereby, the constant-current circuit 131 is separated from the vertical signal line 170.

In this regard, the vertical signal line 170 is pulled up from the power supply via the amp transistor 114 of the selected pixel PX111, and its potential Vsl is raised to the level shown by the following equation.

$$Vsl=Vdd-Vtha$$

where Vdd is a power supply voltage, and Vtha is a threshold value of the amp transistor. Hereon, the channel of the amp transistor is disconnected, and the vertical signal line becomes floated.

If charge is transferred to the FD node 117, the vertical signal line 170 hardly changes because the line is fixed by its parasitic capacity.

On the other hand, at this point, a parasitic capacity is generated between the FD node 117 and the substrate of the amp transistor. Further, the wiring capacity between the vertical signal line 170 and itself is enabled.

Therefore, in this case, the capacity increase effect of the FD node appears and the transfer margin is enlarged.

Note that the configurations of the above described pixel circuits according to the first to fifth embodiments have been respectively explained as individual configurations, however, it is obvious that combinations of these configurations may be applied.

For example, the pixel circuit according to the fourth embodiment may be applied in combination with the other embodiments.

Solid-state image sensing devices including the above described pixel circuits according to the first to fifth embodiments can be applied as imaging devices for digital cameras and video cameras.

6. Sixth Embodiment

Figure 17:
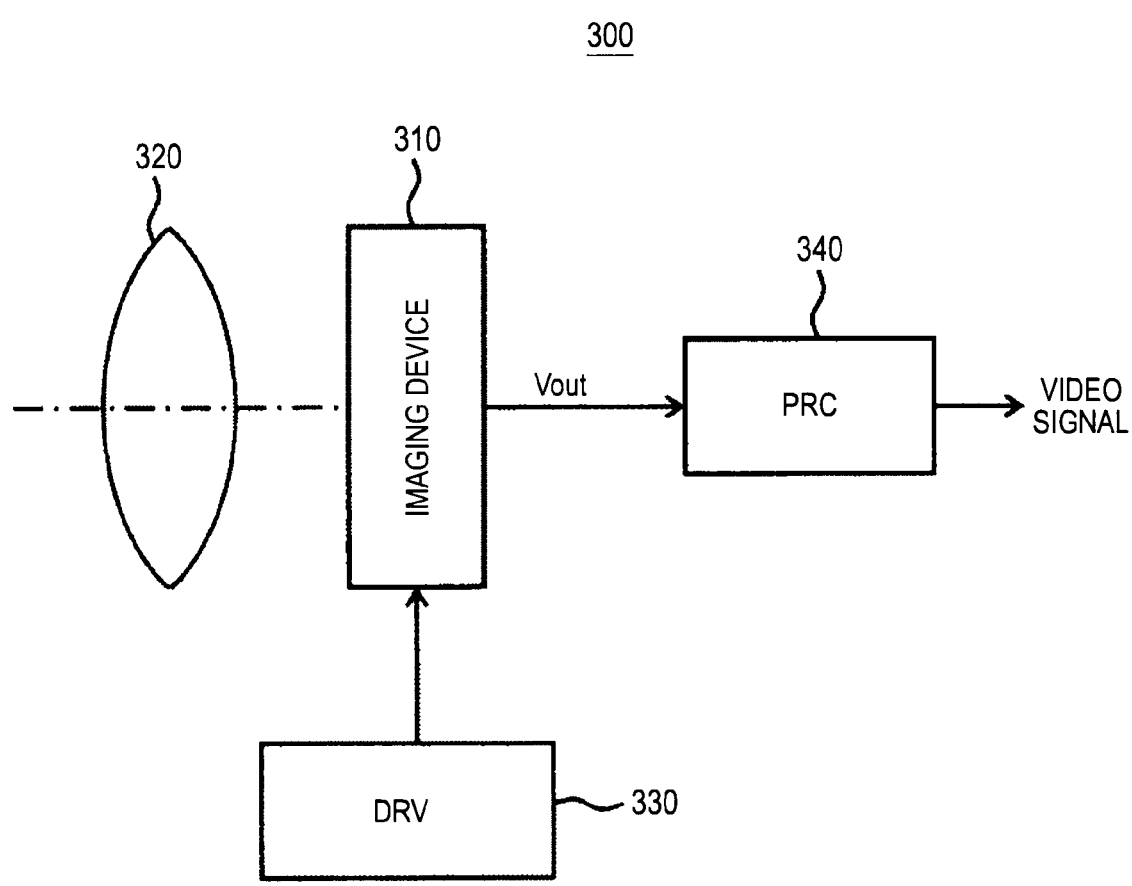
FIG. 17 shows an example of a configuration of a camera system to which the solid-state image sensing device according to the embodiment of the invention is applied.

FIG. 17 shows an example of a configuration of a camera system to which the solid-state image sensing device according to the embodiment of the invention is applied.

The camera system 300 has an imaging device 310 to which a CMOS image sensor (solid-state image sensing device) 100 according to the embodiment can be applied as shown in FIG. 17.

The camera system 300 has an optical system that guides incident light to (forms a subject image on) a pixel area of the imaging device 310, for example, a lens 320 that forms an image of incident light (image light) on an imaging surface.

Further, the camera system 300 has a drive circuit (DRV) 330 that drives the imaging device 310 and a signal processing circuit (PRC) 340 that processes the output signal of the imaging device 310.

The drive circuit 330 has a timing generator (not shown) that generates various timing signals including start pulses and clock pulses for driving the circuits within the imaging device 310, and drives the imaging device 310 with a predetermined timing signal.

Further, the signal processing circuit 340 performs predetermined signal processing on the output signal of the imaging device 310.

The image signals processed in the signal processing circuit 340 are recorded in a recording medium such as a memory, for example. The image information recorded in the recording medium is hard-copied using a printer or the like. Further, the image signals processed in the signal processing circuit 340 are displayed on a monitor of a liquid display or the like as moving images.

As described above, in an imaging apparatus such as a digital still camera, by mounting the above described solid-state image sensing device 100 as the imaging device 310, a highly accurate camera can be realized with low power consumption.

The present application contains subject matter related to that disclosed in Japanese Priority Patent Application JP 2009-172388 filed in the Japan Patent Office on Jul. 23, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A pixel circuit comprising:
a photoelectric conversion device;
a source-follower circuit;
a transfer transistor that transfers charge generated in the photoelectric conversion device to an input node of the source-follower circuit; and
a readout system that reads out a signal in response to the generated charge through the source-follower circuit, wherein the readout system
floats the input node of the source-follower circuit and turns on the transfer transistor to transfer the signal charge to the input node,
includes a function of turning off the transfer transistor, sensing an output node potential of the source-follower circuit, and reading out an output signal, and
further includes an output modulation degree control function unit that temporarily reduces an output modulation degree, the output modulation degree being a potential, of the input node of the source-follower circuit when the transfer transistor is turned on.

2. The pixel circuit according to claim 1, wherein the output modulation degree control function unit includes a clamp circuit, and
connects the clamp circuit to the output node of the source-follower circuit at reduction control of the output modulation degree.

3. The pixel circuit according to claim 1, wherein the output modulation degree control function unit includes a switch device, and
connects the output node of the source-follower circuit to a constant-voltage source at least via the switch device at reduction control of the output modulation degree.

4. The pixel circuit according to claim 1, wherein the output modulation degree control function unit floats the output node of the source-follower circuit at reduction control of the output modulation degree.

5. The pixel circuit according to claim 1, wherein the output modulation degree control function unit connects an output node of another source-follower circuit to the output node of the source-follower circuit at reduction control of the output modulation degree.

6. The pixel circuit according to claim 1, wherein the output modulation degree control function unit shorts output nodes of plural source-follower circuits respectively connected to different pixels via the transfer transistor with respect to one another at reduction control of the output modulation degree.

7. The pixel circuit according to claim 1, wherein the photoelectric conversion devices and the transfer transistors are arranged in an array corresponding to the respective pixels and the corresponding source-follower circuits are arranged in an array, and the output modulation degree control function unit controls a modulation degree of an output signal line shared among the plural source-follower circuits in a column direction at reduction control of the output modulation degree.

8. The pixel circuit according to claim 7, wherein the output modulation degree control function unit includes a switch device, and connects an output signal line of the source-follower circuit to a constant-voltage source at least via the switch circuit at reduction control of the output modulation degree.

9. The pixel circuit according to claim 7, wherein the output modulation degree control function unit floats an output signal line of the source-follower circuit at reduction control of the output modulation degree.

10. A solid-state image sensing device comprising:
a pixel unit in which plural pixel circuits are arranged; and
a pixel drive unit that drives the pixel circuits of the pixel unit and reads out pixel signals,
wherein each pixel circuit includes
a photoelectric conversion device,
a source-follower circuit,
a transfer transistor that transfers charge generated in the photoelectric conversion device to an input node of the source-follower circuit, and
a readout system that reads out a signal in response to the generated charge through the source-follower circuit, and
wherein the readout system
floats the input node of the source-follower circuit and turns on the transfer transistor to transfer the signal charge to the input node,
includes a function of turning off the transfer transistor, sensing an output node potential of the source-follower circuit, and reading out an output signal, and
further includes an output modulation degree control function unit that temporarily reduces an output modulation degree, the output modulation degree being a potential, of the input node of the source-follower circuit when the transfer transistor is turned on.

11. The solid state image sensing device according to claim 10, wherein the output modulation degree control function unit controls the modulation degree of an output signal line shared among plural source-follower circuits, including the source-follower circuit, in a column direction at reduction control of the output modulation degree.

12. A camera system comprising:
a solid-state image sensing device;
an optical system that forms a subject image on the solid-state image sensing device; and
a signal processing circuit that processes an output image signal of the solid-state image sensing device,
wherein the solid-state image sensing device includes
a pixel unit in which plural pixel circuits are arranged, and
a pixel drive unit that drives the pixel circuits of the pixel unit and reads out pixel signals,
wherein each pixel circuit includes
a photoelectric conversion device,
a source-follower circuit,
a transfer transistor that transfers charge generated in the photoelectric conversion device to an input node of the source-follower circuit, and
a readout system that reads out a signal in response to the generated charge through the source-follower circuit, and
wherein the readout system
floats the input node of the source-follower circuit and turns on the transfer transistor to transfer the signal charge to the input node,
includes a function of turning off the transfer transistor, sensing an output node potential of the source-follower circuit, and reading out an output signal, and
further includes an output modulation degree control function unit that temporarily reduces an output modulation degree, the output modulation degree being a potential, of the input node of the source-follower circuit when the transfer transistor is turned on.

13. The camera system according to claim 12, wherein the output modulation degree control function unit controls a modulation degree of an output signal line shared among plural source-follower circuits, including the source-follower circuit, in a column direction at reduction control of the output modulation degree.

* * * * *